(12) United States Patent
Zhou et al.

(10) Patent No.: US 9,601,336 B2
(45) Date of Patent: Mar. 21, 2017

(54) TRENCH FIELD-EFFECT DEVICE AND METHOD OF FABRICATING SAME

(75) Inventors: Hongwei Zhou, Jiangsu (CN); Dongyue Gao, Jiangsu (CN)

(73) Assignee: CSMC TECHNOLOGIES FAB1 CO., LTD., Jiangsu (CN)

( * ) Notice: Subject to any disclaimer, the term of this patent is extended or adjusted under 35 U.S.C. 154(b) by 0 days.

(21) Appl. No.: 14/376,021

(22) PCT Filed: Jul. 18, 2012

(86) PCT No.: PCT/CN2012/078793
§ 371 (c)(1),
(2), (4) Date: Jul. 31, 2014

(87) PCT Pub. No.: WO2013/117077
PCT Pub. Date: Aug. 15, 2013

(65) Prior Publication Data
US 2015/0214061 A1    Jul. 30, 2015

(30) Foreign Application Priority Data
Feb. 10, 2012    (CN) .......................... 2012 1 0030159

(51) Int. Cl.
*H01L 21/28* (2006.01)
*H01L 29/423* (2006.01)
(Continued)

(52) U.S. Cl.
CPC .... *H01L 21/28229* (2013.01); *H01L 29/4236* (2013.01); *H01L 29/42368* (2013.01);
(Continued)

(58) Field of Classification Search
None
See application file for complete search history.

(56) References Cited

U.S. PATENT DOCUMENTS 4,409,260 A * 10/1983 Pastor ...................... C23C 8/14
148/283
5,021,355 A * 6/1991 Dhong ................ H01L 21/2236
257/E21.143
(Continued)

FOREIGN PATENT DOCUMENTS

CN    1726586 A    1/2006
CN    1956153 A    5/2007
(Continued)

OTHER PUBLICATIONS

Ghandi, VLSI Fabrication Principles, 2 ed. John Wiley & Sons: New York, 1994, p. 456.*
(Continued)

*Primary Examiner* — Erik Kielin
(74) *Attorney, Agent, or Firm* — Muncy, Geissler, Olds & Lowe, P.C.

(57) ABSTRACT

The present invention provides a method of fabricating a trench field-effect device. The method includes: providing a substrate including an epitaxial layer formed on a semiconductor substrate of the substrate and a trench formed in the epitaxial layer; forming a sacrificial dielectric layer on a bottom and a sidewall of the trench; forming a heavily-doped polysilicon region at the bottom, and removing part of the sacrificial dielectric layer not covered by the heavily-doped polysilicon region to expose an epitaxial layer of the sidewall; and oxidizing the heavily-doped polysilicon region and the epitaxial layer simultaneously and forming a thick oxide layer and a trench sidewall gate dielectric layer synchronously on the bottom and the sidewall, respectively; wherein thickness of the thick oxide layer is greater than that of the trench sidewall gate dielectric layer. The method is simple, and figure of merit of the fabricated trench field-effect device is reduced.

10 Claims, 6 Drawing Sheets

(51) Int. Cl.
  *H01L 29/66* (2006.01)
  *H01L 29/78* (2006.01)
(52) U.S. Cl.
  CPC .... *H01L 29/66734* (2013.01); *H01L 29/7813* (2013.01); *H01L 29/7827* (2013.01)

(56) References Cited

U.S. PATENT DOCUMENTS

| | | | | |
|---|---|---|---|---|
| 5,545,908 | A * | 8/1996 | Tokura | H01L 29/0878 |
| | | | | 257/139 |
| 5,970,352 | A * | 10/1999 | Shiozawa | H01L 21/76895 |
| | | | | 257/E21.43 |
| 6,455,378 | B1 * | 9/2002 | Inagawa | H01L 29/7808 |
| | | | | 257/E29.121 |
| 6,882,000 | B2 * | 4/2005 | Darwish | H01L 29/42368 |
| | | | | 257/302 |
| 7,009,247 | B2 | 3/2006 | Darwish | |
| 7,767,530 | B2 * | 8/2010 | Cho | H01L 29/7813 |
| | | | | 257/330 |
| 2001/0026961 | A1 * | 10/2001 | Williams | H01L 29/0878 |
| | | | | 438/142 |
| 2006/0017097 | A1 * | 1/2006 | Hijzen | H01L 29/42368 |
| | | | | 257/330 |
| 2006/0121676 | A1 * | 6/2006 | Darwish | H01L 21/2253 |
| | | | | 438/272 |
| 2006/0199319 | A1 * | 9/2006 | Takaishi | H01L 29/404 |
| | | | | 438/197 |
| 2009/0072306 | A1 | 3/2009 | Izumi | |
| 2010/0163978 | A1 * | 7/2010 | Magri | H01L 29/4916 |
| | | | | 257/334 |

FOREIGN PATENT DOCUMENTS

| | | |
|---|---|---|
| CN | 101131933 A | 2/2008 |
| CN | 10211977 A | 7/2008 |
| CN | 102194694 A | 9/2011 |

OTHER PUBLICATIONS

Sunami, Hideo, "Thermal Oxidation of Phosphorus-doped Polycrystalline Silicon in Wet Oxygen," Journal of the Electrochemical Society, vol. 125, No. 6, 1978, p. 892.*

* cited by examiner

TRENCH FIELD-EFFECT DEVICE AND METHOD OF FABRICATING SAME

FIELD OF THE INVENTION

The present invention relates to semiconductor power device fabrication technical fields, more particularly, to a trench field-effect device and a method of fabricating the same.

BACKGROUND OF THE INVENTION

In a number of power management applications, in order to increase energy conversion efficiency, a work frequency of a trench field-effect device (trench MOSFET) greater than 500 KHz is required. This requires that the trench field-effect device (trench MOSFET) has a smaller gate charge and a smaller on-state resistance. Therefore, continuously reducing a figure of merit (i.e., a product of the gate charge $Q_g$ and the on-state resistance $R_{on}$ of the trench field-effect device) of the trench field-effect device is a goal that people pursue to keep optimizing the trench field-effect device. In a prior art, people generally form a thick oxide layer (the thickness of the thick oxide layer is greater than that of a trench sidewall gate dielectric layer) in a bottom of a trench to reduce the gate charge and the figure of merit of the trench field-effect device.

In the prior art, there are a number of methods for forming a trench thick oxide, such as local thermal oxidation (LOCOS), high-density plasma deposition (HDP), etc. There is also a literature that uses lightly-doped polysilicon to form the thick oxide layer of the bottom of the trench. However, in a practical fabrication process, it is found that the figure of merit of the trench field-effect device is higher using the above techniques and the fabrication is more complicated.

SUMMARY OF THE INVENTION

An object of the invention is to reduce the figure of merit of the trench field-effect device.

Another object of the invention is to simplify the fabrication of the trench field-effect device.

In order to achieve the above objects or other objects, the invention discloses the following technical solutions.

According to one aspect of the disclosure, a method of fabricating a trench field-effect device includes steps:
providing a substrate, the substrate including an epitaxial layer formed on a semiconductor substrate of the substrate and a trench formed in the epitaxial layer;
forming a sacrificial dielectric layer on a bottom and a sidewall of the trench;
forming a heavily-doped polysilicon region at the bottom of the trench, and removing part of the sacrificial dielectric layer that is not covered by the heavily-doped polysilicon region to expose an epitaxial layer of the sidewall of the trench; and
oxidizing the heavily-doped polysilicon region and the epitaxial layer of the sidewall of the trench simultaneously, and forming a thick oxide layer and a trench sidewall gate dielectric layer synchronously on the bottom and the sidewall of the trench, respectively;
wherein the thickness of the thick oxide layer is greater than that of the trench sidewall gate dielectric layer formed with the thick oxide layer synchronously, and the thick oxide layer is used as a trench bottom gate dielectric layer of the trench field-effect device.

According to a fabricating method of an embodiment of the present invention, the epitaxial layer is relatively-lightly-doped monocrystalline silicon.

Furthermore, the semiconductor substrate is a monocrystalline silicon substrate, and the doping concentration of the epitaxial layer is smaller than that of the semiconductor substrate.

Furthermore, the doping concentration of the heavily-doped polysilicon region is over 20 times greater than that of the epitaxial layer.

According to a fabricating method of another embodiment of the present invention, the doping concentration of the epitaxial layer is less than or equal to $5E17$ $cm^{-3}$.

In the fabricating method of any above embodiment, furthermore, the doping concentration of the heavily-doped polysilicon region is greater than or equal to $1E19$ $cm^{-3}$.

In the fabricating method of any above embodiment, furthermore, a growth speed of the thick oxide layer is greater than that of the trench sidewall gate dielectric layer during oxidization.

In the fabricating method of any above embodiment, furthermore, the oxidization uses a thermal oxidation process with high-pressure-and-wet-oxygen conditions.

In the fabricating method of any above embodiment, furthermore, a pressure of the thermal oxidation process is greater than one standard atmospheric pressure.

In the fabricating method of any above embodiment, furthermore, the thickness of the heavily-doped polysilicon region is in a range from 400 Å to 5000 Å.

According to a fabricating method of yet another embodiment of the present invention, the thickness of the thick oxide layer is 2 to 4 times greater than that of the trench sidewall gate dielectric layer.

In the fabricating method of any above embodiment, furthermore, the thickness of the thick oxide layer is greater than or equal to 400 Å and less than or equal to 6000 Å.

In the fabricating method of any above embodiment, furthermore, a doping type of the heavily-doped polysilicon region is N-type.

In the fabricating method of any above embodiment, furthermore, the thickness of the sacrificial dielectric layer is in a range from 400 Å to 2000 Å.

In the fabricating method of any above embodiment, furthermore, the thick oxide layer is formed on a sacrificial dielectric layer of the bottom of the trench, part of the sacrificial dielectric layer covered by the heavily-doped polysilicon region and the thick oxide layer cooperatively form a trench bottom gate dielectric layer in a gate dielectric layer of the trench field-effect device.

According to another aspect of the disclosure, the present invention also provides a trench field-effect device fabricated by any above method.

As compared with the prior art, the above technical solutions at least have the following advantages:

In a conventional fabricating method of the trench power field-effect device, a trench bottom gate dielectric layer and a trench sidewall gate dielectric layer are simultaneously formed. However, because of factors such as stress, etc., the thickness of the trench bottom gate dielectric layer is slightly smaller than that of the trench sidewall gate dielectric layer. In the method of fabricating the trench field-effect device of embodiments of the present invention, the thick oxide layer is formed in the trench bottom gate dielectric layer to increase the thickness of the trench bottom gate dielectric layer, and simultaneously the feature of oxidization rate of the heavily-doped polysilicon greater than that of the relatively-lightly-doped monocrystalline silicon under environment such as high pressure and wet oxygen environment is used to form the thick oxide layer and the trench sidewall gate dielectric layer synchronously on the bottom and the sidewall of the trench, respectively. Therefore, the fabricating process of the gate dielectric layer of the trench power field-effect device is greatly simplified. Furthermore, the thickness of the thick oxide layer can be 2 to 4 times larger than that of the trench sidewall gate dielectric layer, thereby reducing capacitance between drain and gate of the trench field-effect device and reducing the figure of merit of the trench field-effect device.

BRIEF DESCRIPTION OF THE DRAWINGS

In order to clearly describe the technical solutions in embodiments of the present invention or in the prior art, the followings are simple introduction to the drawings used in the descriptions of the embodiments or the prior art. Obviously, the drawings in the following descriptions are only some embodiments of the present invention. Those skilled in the art, without making creative work, also can get other drawings of other embodiments according to these drawings.

DETAILED DESCRIPTION OF THE EMBODIMENTS

Figure 1:
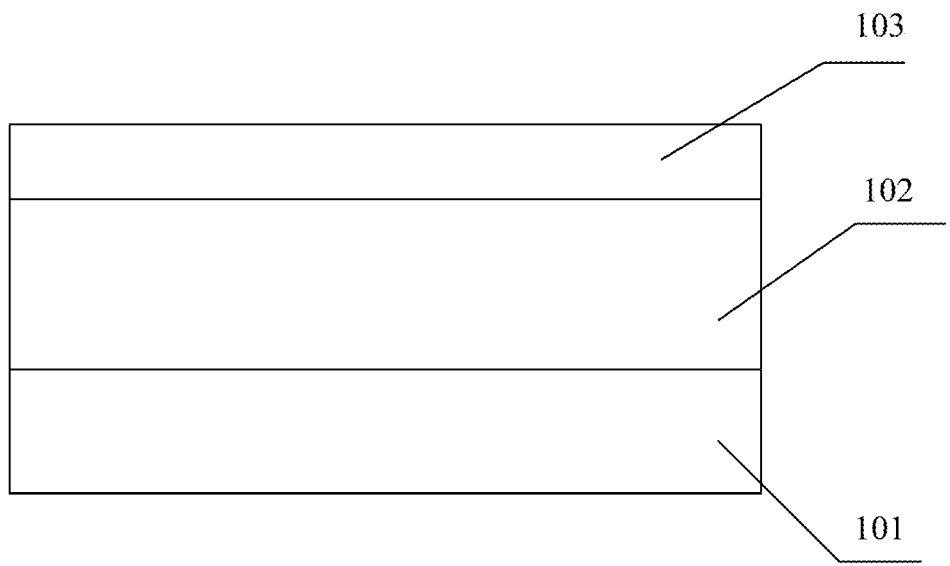
FIGS. 1 to 6 are sectional views showing structure changes in a process of a method of fabricating a trench field-effect device according to an embodiment.

The followings are clearly and completely described to the technical solutions in embodiments of the present invention incorporating with the drawings in the embodiments of the present invention. Obviously, the described embodiments are only part of embodiments of the present invention, not all embodiments. Based on the embodiments in the present invention, all other embodiments that are made by those skilled in the art without making creative work are included in the scope of the present invention.

Although the following descriptions are details to fully understand the present invention, the present invention also can use other ways different form these descriptions to implement. Those skilled in the art can make possible changes and modifications without departing from the meaning of the present invention. Therefore, the present invention is not limited to the following disclosed embodiments.

Secondly, the present invention describes details incorporating with the drawings. When describing embodiments of the present invention in detail, for convenient description, sectional views of the device structure will not be partially enlarged according to a general proportion and the drawings are only illustrative and do not limit the scope of the present invention. Besides, three space dimensions of length, width and depth are included in a practical fabrication.

As described in the background, when a fabricating method in which a thick oxide trench field-effect device is formed by using a lightly-doped polysilicon in the prior art is used to fabricate a trench field-effect device, the fabrication is very complicated. The applicant researches to find that, this is because although an oxidization rate of the lightly-doped polysilicon is a little greater than that of a lightly-doped monocrystalline silicon, the difference is not big, and generally a thick oxide layer is formed on a bottom of a trench by oxidizing the polysilicon and simultaneously an oxide layer with certain thickness is formed on a sidewall of the trench. Therefore, at this time, a difference between the thicknesses of the thick oxide layer of the bottom of the trench and the oxide layer of the sidewall of the trench is not big. Under the circumstance of forming thick-enough thick oxide layer being needed, the thickness of the oxide layer simultaneously formed on the sidewall is hard to meet a preset target thickness requirement of a gate dielectric layer. If it needs to form a gate dielectric layer with an ideal thickness, the oxide layer on the sidewall of the trench needs to be removed by etching and then the gate dielectric layer grows to form the trench sidewall gate dielectric layer. In this method, on one hand, the oxide layer of the sidewall needs to be re-etched and grow, which has the shortcoming of complicated process, on another hand, in the process of etching the oxide layer on the sidewall of the trench, because the difference between the thickness of the trench bottom oxide layer and the thickness of the trench sidewall oxide layer is not big, etching the oxide layer of the sidewall of the trench simultaneously causes remove of the trench bottom oxide layer by etching, and finally the effective thickness of the thick oxide layer formed on the bottom of the trench by using the lightly-doped polysilicon is made to be not thick enough and the effect of reducing the figure of merit of the trench field-effect device is not very obvious.

Accordingly, the present invention provides a method of fabricating a trench field-effect device. FIGS. 1 to 6 are sectional views showing structure changes in a process of a method of fabricating a trench field-effect device according to an embodiment. A basic process of a method of fabricating a trench field-effect device according to an embodiment is described together with FIGS. 1 to 6.

Firstly, step 1: a substrate is provided, which includes a body layer and a trench in a surface of the body layer.

Figure 2:
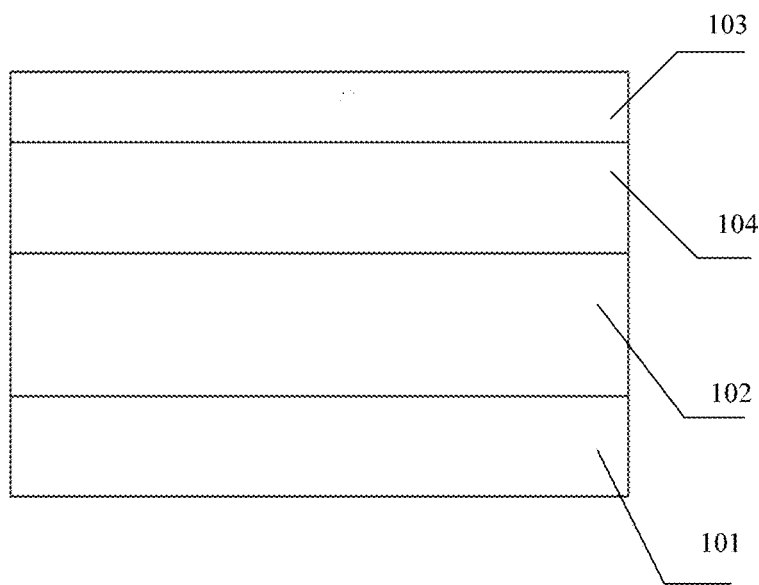

As shown in FIG. 1, the substrate is used for fabricating one or more trench field-effect devices. The body layer of the substrate includes: a semiconductor substrate 101, an epitaxial layer 102 on a surface of the semiconductor substrate 101 and a dielectric barrier layer 103 on a surface of the epitaxial layer 102. Furthermore, in the embodiment, as shown in FIG. 2, a patterned doping is applied to the epitaxial layer 102 to form a well region 104. The well region 104 is used for forming a body region.

In the embodiment, the semiconductor substrate 101 can be selected to be a monocrystalline silicon substrate. It is noted that the semiconductor substrate in the embodiment can be formed based on various semiconductor elements.

For example, the semiconductor substrate can be monocrystalline, polycrystalline or amorphous structure silicon or silicon germanium (SiGe); the semiconductor substrate can also be formed by various compound semiconductor materials. For example, the semiconductor substrate can be a substrate formed by silicon carbide, indium antimonide, lead telluride, indium arsenide, indium phosphide, gallium arsenide, or gallium antimonide or any combination of the above materials. The semiconductor substrate can also be silicon-on-insulator (SOI). Besides, the semiconductor substrate can further include other materials, such as multilayer structure of the epitaxial layer 102 or a buried oxide layer. Although some examples of material are described to form the semiconductor substrate, any material that can be used for the semiconductor substrate is included in the spirit and scope of the present invention.

In the embodiment, the epitaxial layer 102 can be formed on the semiconductor substrate 101 by one-time growth and can be an N-type or a P-type epitaxial layer. Therefore, material type of the epitaxial layer 102 is substantially the same as that of the semiconductor substrate 101. In the embodiment, the epitaxial layer 102 is monocrystalline silicon material. After epitaxial growth, a process such as thermal oxidation or CVD (chemical vapor deposition) can be used to form a dielectric barrier layer 103 on a surface of the epitaxial layer 102. The dielectric barrier layer 103 is used as a barrier layer in a subsequent ion implantation process to prevent surface damage. In the embodiment of the present invention, the thickness of the dielectric barrier layer 103 is in a range from 400 Å-1000 Å (such as 600 Å). The specific thickness is determined according to a practical use of the device. Specifically, the dielectric barrier layer 103 can be but not limited to silicon oxide. The semiconductor substrate 101 can be N+ doped and the epitaxial layer 102 can be N− doped. The epitaxial layer 102 is used for forming a drift region of the trench field-effect device and a doping concentration of the epitaxial layer 102 is smaller than that of the semiconductor substrate 101. Requirement of the doping concentration of the epitaxial layer 102 is further described below.

The dielectric barrier layer 103 is used as a mask, and a process such as ion implantation or high-energy ion implantation is used for doping the epitaxial layer 102 to form the well region 104 in the epitaxial layer, i.e., to form an N-type well region or a P-type well region. If a doping type is N-type, a doping ion can be phosphorus or other pentavalent elements. If the doping type is P-type, the doping ion can be boron or other trivalent elements. The doping type being the P-type is made an example in the embodiment of the present invention. In the embodiment, a high-energy ion implanter can be used for implanting boron element and a P− well region 104 is formed after high-temperature annealing.

Figure 3:
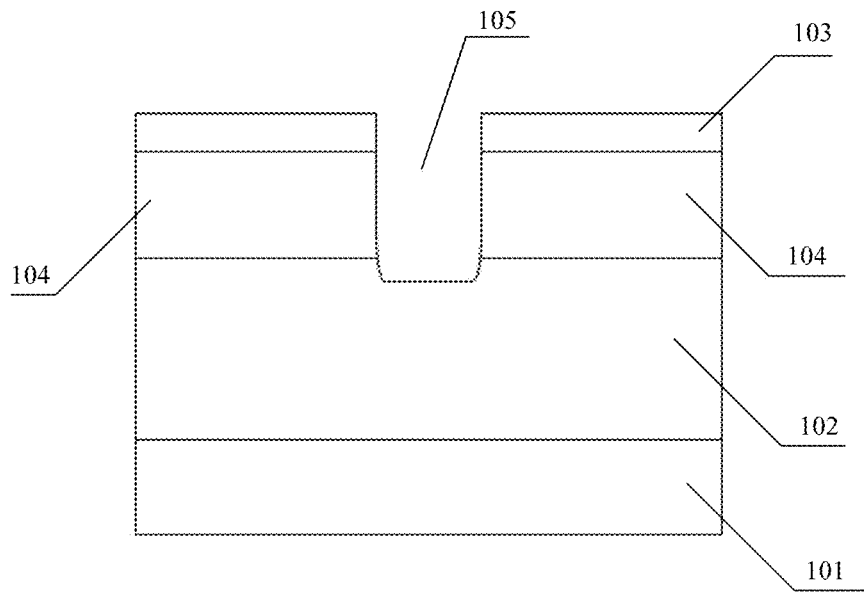

After the P− well region 104 is formed, a photoresist layer is spin-coated on the dielectric barrier layer 103. In order to ensure the exposure accuracy, an antireflective layer (not shown in drawings) can be formed between the photoresist layer and the dielectric barrier layer 103 to reduce unnecessary reflection. Then the photoresist layer is exposed by using a mask having a trench pattern to form a trench pattern on a surface of the photoresist layer. A photoresist layer having the trench pattern is obtained after developing. Furthermore, the photoresist layer having the trench pattern is used as a mask, and a process such as reactive ion etching is used to form a trench pattern opening on the dielectric barrier layer 103. Furthermore, a method such as chemical cleaning is used to remove the photoresist layer and the antireflective layer. Furthermore, the dielectric barrier layer 103 having the trench pattern opening is used as a mask, and a method such as wet etching or dry etching is used to remove material that is not covered by the dielectric barrier layer 103. A trench 105 is formed in the epitaxial layer 102 as shown in FIG. 3.

Figure 4:
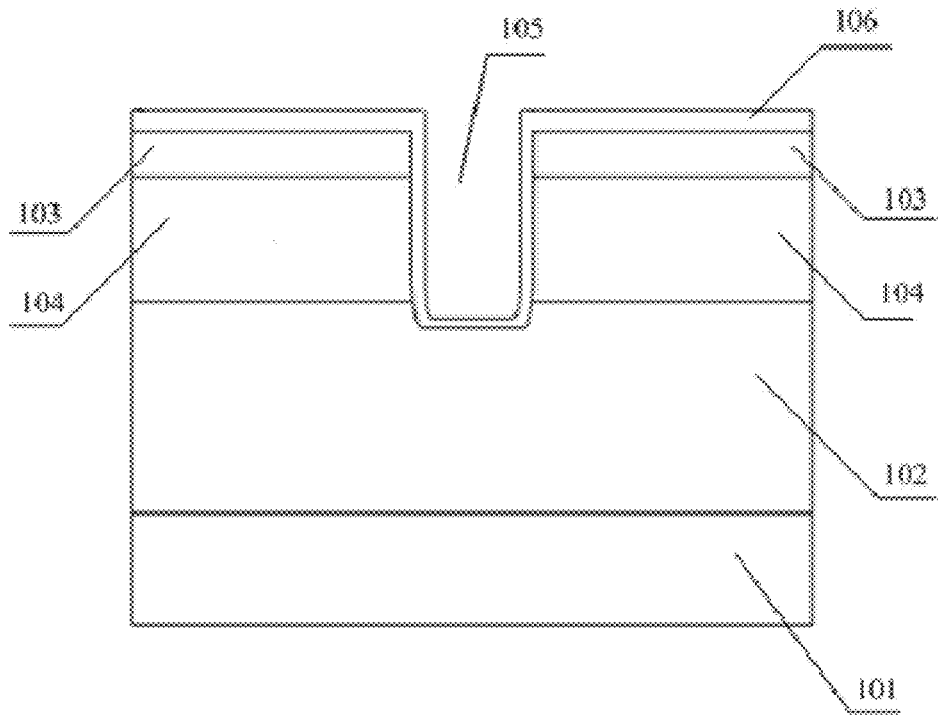

Sequentially, step 2: as shown in FIG. 4, a sacrificial dielectric layer 106 is formed on a bottom and a sidewall of the trench 105.

After the trench 105 is formed, a thermal oxidation process can but not limited to be used to grow a sacrificial dielectric layer, i.e., the sacrificial dielectric layer 106, on the bottom and the sidewall (i.e., a trench inner wall) of the trench 105. In the embodiment, the thickness of the sacrificial dielectric layer 106 is greater than or equal to 400 Å and is less than or equal to 2000 Å, such as 1000 Å. As shown in FIG. 3, part of the sacrificial dielectric layer 106 can simultaneously cover the dielectric barrier layer 103.

Figure 5:
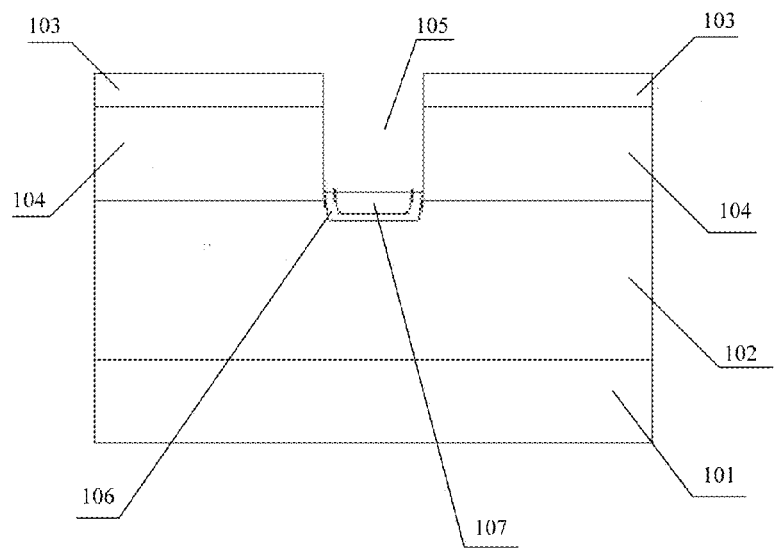

Sequentially, step 3: as shown in FIG. 5, a heavily-doped polysilicon region 107 is formed on the bottom of the trench 105 and part of the sacrificial dielectric layer that is not covered by the heavily-doped polysilicon region 107 is removed to expose the epitaxial layer of the sidewall of the trench (when the depth of the trench 105 is greater, the exposed epitaxial layer can include 102 and the epitaxial layer of a sidewall part corresponding to the well region 104).

In the embodiment, after the sacrificial dielectric layer 106 is formed, a process such as CVD or PECVD (plasma enhanced chemical vapor deposition) can be used to deposit an in-situ heavily-doped polysilicon layer with a certain thickness on a surface of the sacrificial dielectric layer 106. When a deposition process is used, because of structural feature of the trench, the polysilicon layer that is deposited on the bottom of the trench is thicker; and maybe when depositing the polysilicon, the deposited heavily-doped polysilicon layer can at least substantially fill the bottom of the trench 105. In a later process, a polysilicon etch-back process can be used to remove the polysilicon layer on the dielectric barrier layer 103 and on the sidewall of the trench 105. The in-situ heavily-doped polysilicon layer on the bottom of the trench 105 is only kept to form the heavily-doped polysilicon region 107 as shown in FIG. 5. It should be noted that, in the process of etching-back the polysilicon layer, the dielectric barrier layer on the surface of the dielectric barrier layer 103 and on the sidewall of the trench 105 can be simultaneously removed by etching-back. Therefore, part of the sacrificial dielectric layer 106 that is not covered by the heavily-doped polysilicon region 107 is basically kept, i.e., in the embodiment, the sacrificial dielectric layer of the sidewall of the trench on the heavily-doped polysilicon region 107 is removed. Specifically, the heavily-doped polysilicon region 107 is formed on part of the sacrificial dielectric layer 106.

In the embodiment, the thickness of the kept heavily-doped polysilicon region 107 can be greater than or equal to 400 Å and less than or equal to 5000 Å, such as 2000 Å. The thickness of the heavily-doped polysilicon region 107 can be controlled by the etch-back process to achieve the thickness control. Under the circumstance of the thickness of to-be-formed thick oxide layer being determined, the thickness of the heavily-doped polysilicon region 107 is at least greater than or equal to that of the polysilicon used for forming the thick oxide layer by oxidizing. Those skilled in the art with the above teach and suggestion determines the thickness of the heavily doped polysilicon region 107 according to the to-be-formed thick oxide layer. Type of the heavily-doped polysilicon region 107 can but not limited to be N-type. In the embodiment, the doping concentration of the heavily-doped polysilicon region is greater than or equal to 1E19 $cm^{-3}$, for example, the doping concentration can be 5E19 $cm^{-3}$.

Figure 6:
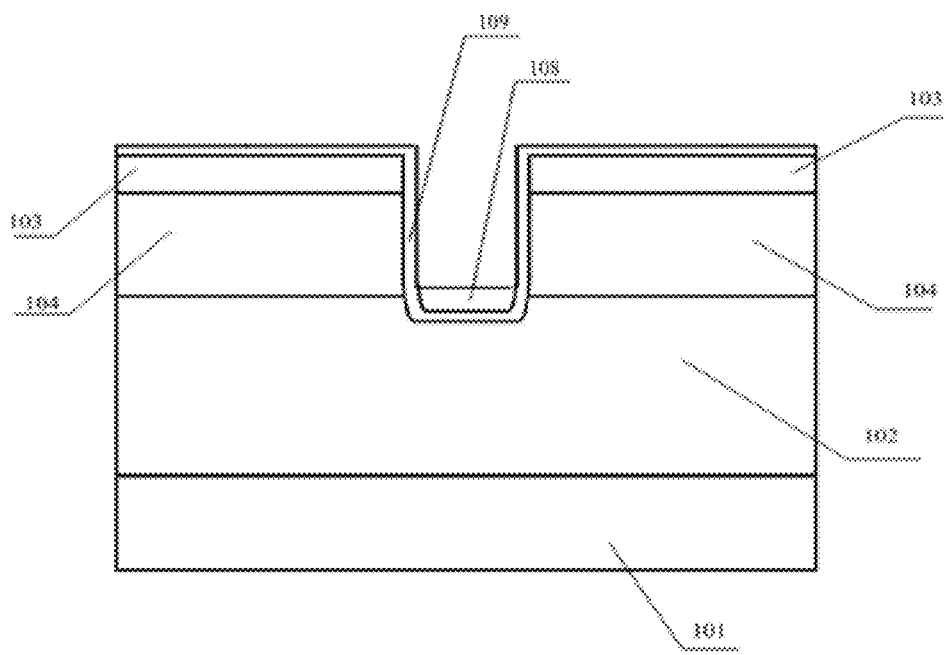

Sequentially, step 4: as shown in FIG. 6, the heavily-doped polysilicon region 107 and the epitaxial layer of the sidewall of the trench are oxidized simultaneously and a thick oxide layer 108 and a trench sidewall gate dielectric layer 109 are formed synchronously on the bottom and the sidewall of the trench, respectively. The thickness of the thick oxide layer 108 is greater than that of the trench sidewall gate dielectric layer 109 formed synchronously together with the thick oxide layer 108.

In present invention, the applicant finds that under the same oxidization-process condition, an oxidation rate of the heavily-doped polysilicon is generally greatly greater than that of relatively-lightly-doped monocrystalline silicon (for example, their oxidation rates differ from an order of magnitude). Therefore, under the same oxidization-process condition, when the exposed epitaxial layer (part of the sidewall of the trench) and the heavily-doped polysilicon region 107 are oxidized synchronously, the heavily-doped polysilicon region 107 is at least partially oxidized to form the thick oxide layer 108 as shown in FIG. 6, and the sidewall of the trench is partially oxidized to form the trench sidewall gate dielectric layer 109 as shown in FIG. 6. The thickness of the thick oxide layer 108 is greatly greater than that of the trench sidewall gate dielectric layer 109. In a preferable embodiment, in order to make a difference between the thickness of the thick oxide layer 108 and the thickness of the trench sidewall gate dielectric layer 109 more bigger, the doping concentrations of the epitaxial layer 102 and the well region 104 of the epitaxial layer (they both are monocrystalline silicon epitaxial layers) are set to be less than or equal to 5E17 $cm^{-3}$ (such as 1E17 $cm^{-3}$). In this way, the doping concentration of the heavily-doped polysilicon region 107 is at least 20 times higher than that of the monocrystalline silicon of the sidewall of the trench. The difference between oxidation rates is greater.

Furthermore, preferably, under a high-pressure-and-wet-oxygen environment, when a thermal oxidation process is used to oxidize the heavily-doped polysilicon region 107 on the bottom of the trench 105 and the monocrystalline silicon of the sidewall of the trench 105 synchronously, the difference between their oxidation rates is further increased. Specifically, pressure parameters of the thermal oxidation process can be set to be greater than one standard atmospheric pressure (such as 1.2 standard atmospheric pressures), and the temperature of thermal oxidation is in a range from 800° C. to 1200° C. (such as 850° C.). Those skilled in the art with the above teach and suggestion can set specific parameters, such as conditions of the thermal oxidation process, the doping concentration of the heavily-doped polysilicon region 107, the doping concentrations of the epitaxial layer 102 and the well region 104 of the epitaxial layer, according to the thickness of the to-be-formed sidewall gate dielectric layer and the thickness of the to-be-formed thick oxide layer 108.

In an embodiment, the thickness of the thick oxide layer 108 is greater than or equal to 400 Å and less than or equal to 6000 Å (such as 0.4 microns). The thickness of the thick oxide layer 108 is more-than-twice than that of the trench sidewall gate dielectric layer 109. The thick oxide layer 108 and the sacrificial dielectric layer 106 below the thick oxide layer 108 cooperatively form a trench bottom gate dielectric layer. The thickness of the thick oxide layer 108 formed based on the method is far greater than that of the trench sidewall gate dielectric layer 109, thereby greatly reducing the figure of merit of the trench field-effect device. Furthermore, the thick oxide layer 108 and the trench sidewall gate dielectric layer 109 can be formed synchronously, which simplifies the fabrication.

Furthermore, other process steps (such as forming polysilicon gate in the trench) of the trench field-effect device can be finished continuously to fabricate the trench field-effect device provided by the embodiment of the present invention. The other process steps after forming the gate dielectric layer can use routine methods, and therefore, they are not limited by the present invention and details are not described here.

It should be noted that, in the above embodiment, as shown in FIG. 6, all heavily-doped polysilicon region 107 can be oxidized in the step 4 to form the thick oxide layer 108; in other embodiments, the heavily-doped polysilicon region 107 may not be all-oxidized, therefore, there may be heavily-doped polysilicon layer (not shown in FIG. 6) existing between the thick oxide layer 108 and the sacrificial dielectric layer 106.

Figure 7:
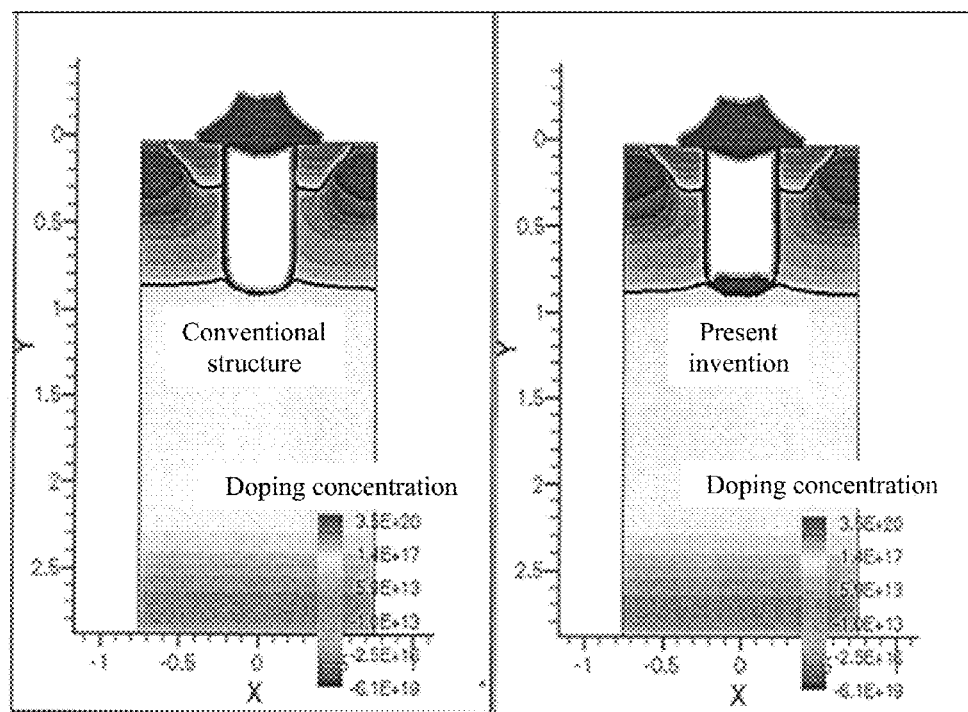
FIG. 7 is a simulation schematic view showing structure doping comparison between a conventional trench field-effect device and a trench field-effect device according to an embodiment.

Referring to FIG. 7, FIG. 7 is a simulation schematic view showing structure doping comparison between a conventional trench field-effect device and a trench field-effect device according to an embodiment of the present invention. It can be seen from FIG. 7 that as compared with the conventional trench field-effect device, the thickness of the trench bottom gate dielectric layer of the trench field-effect device that the present invention provides is greatly increased. The thickness of the thick oxide layer of the trench bottom gate dielectric layer is 2 to 4 times of the thickness of the trench sidewall gate dielectric layer. With similar process conditions, the thickness of the trench bottom gate dielectric layer is substantially the same as that of the trench sidewall gate dielectric layer in the conventional trench field-effect device. Therefore, the thickness of the trench bottom gate dielectric layer in the trench field-effect device that the present invention provides is 2 to 4 times greater than that of the trench bottom gate dielectric layer in the conventional trench field-effect device with the similar process conditions, thereby reducing capacitance between drain and gate of the trench field-effect device and reducing the figure of merit of the trench field-effect device and simplifying the fabrication.

Figure 9:
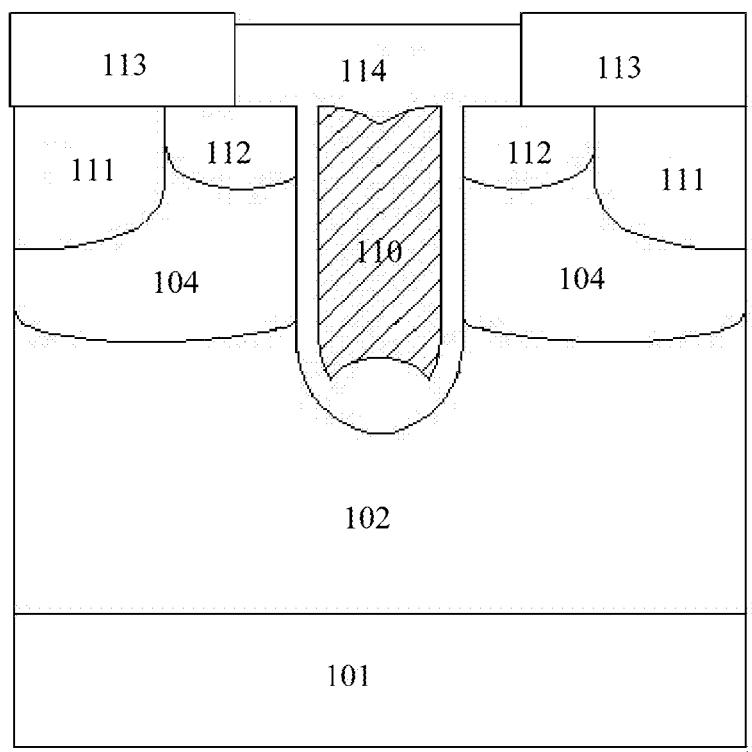
FIG. 9 is a schematic view of a trench field-effect device according to an embodiment.

An embodiment of the present invention also discloses a trench field-effect device fabricated by the above method, as shown in FIG. 9. FIG. 9 is a schematic view of a trench field-effect device according to an embodiment. The trench field-effect device of this embodiment includes:

A body layer, the body layer including a semiconductor substrate 101, and an epitaxial layer 102 on a surface of the semiconductor substrate 101;

A well region 104 and a trench 105 in the epitaxial layer 102, where the bottom of the trench 105 has a thick oxide layer used for forming a trench bottom gate dielectric layer. The sidewall of the trench 105 forms a trench sidewall dielectric layer. The thick oxide layer and the trench sidewall gate dielectric layer are formed by synchronous oxidization. The thickness of the thick oxide layer of the trench bottom gate dielectric layer is 2 to 4 times greater than that of the trench sidewall gate dielectric layer.

In addition, the trench field-effect device of the embodiment of the present invention further includes the followings that are formed by using a conventional trench field-effect process:

A polysilicon gate 110 in the trench 105;

A P+ contact region 111 in the P-type well region 104 and an N+ source 112 between the P+ contact region 111 and the trench 105;

A metallic source 113 on a surface of the P+ contact region 111 and the metallic source 113 covering part of the N+ source 112; and An oxide layer 114 on the polysilicon gate 110 and in middle of the metallic source 113.

Figure 8:
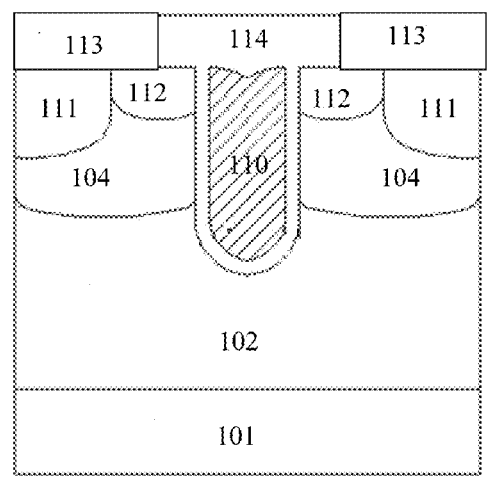
FIG. 8 is a schematic view of a conventional trench field-effect device.

FIG. 8 is a schematic view of a conventional trench field-effect device. It can be seen from FIG. 8 and FIG. 9 that in the trench field-effect device that the embodiment of the present invention provides, the bottom of the trench 105 has a thicker trench bottom gate dielectric layer as compared with the conventional trench field-effect device, thereby reducing capacitance between gate and drain of the trench field-effect device and further reducing gate charge of the trench field-effect device and greatly reducing the figure of merit of the trench field-effect device.

Figure 10:
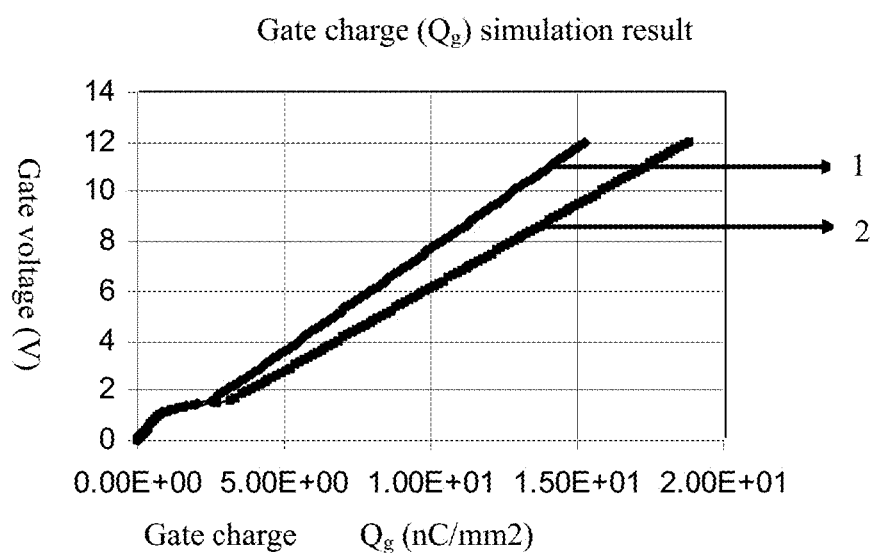
FIG. 10 is a curve diagram showing change of the gate charge of a trench field-effect device along with the gate voltage, where a curve of change of the gate charge of a trench field-effect device along with the gate voltage according to an embodiment and a curve of change of the gate charge of a conventional trench field-effect device along with the gate voltage are included.

FIG. 10 is a curve diagram showing change of the gate charge of a trench field-effect device along with the gate voltage, where a curve of change of the gate charge of a trench field-effect device along with the gate voltage according to an embodiment and a curve of change of the gate charge of a conventional trench field-effect device along with the gate voltage are included. Referring to FIG. 10, the breakdown voltage of the trench field-effect device is 65V for example. Curve 1 is a curve of change of the gate charge of a trench field-effect device (such as the trench field-effect device as shown in FIG. 9) along with the gate voltage according to an embodiment; curve 2 is a curve of change of the gate charge of a conventional trench field-effect device (such as the trench field-effect device as shown in FIG. 8) along with the gate voltage. It can be seen from FIG. 10 that, when $V_{gs}$=4.5V, as compared with the conventional trench field-effect device, the gate charge of the trench field-effect device that the embodiment of the present invention provides is reduced by 20%.

Figure 11:
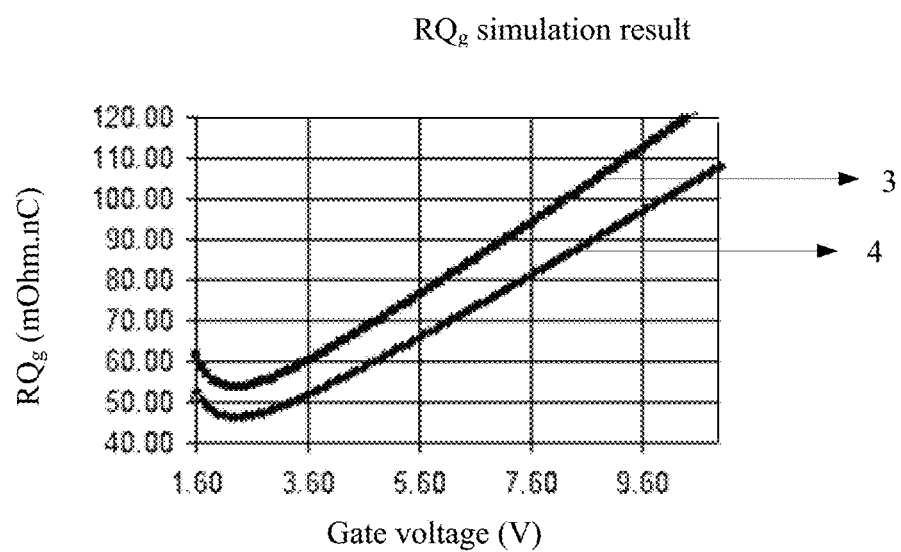
FIG. 11 is a curve diagram showing change of the figure of merit of a trench field-effect device along with the gate voltage, where a curve of change of the figure of merit of a trench field-effect device along with the gate voltage according to an embodiment and a curve of change of the figure of merit of a conventional trench field-effect device along with the gate voltage are included.

FIG. 11 is a curve diagram showing change of the figure of merit of a trench field-effect device along with the gate voltage, where a curve of change of the figure of merit of a trench field-effect device along with the gate voltage according to an embodiment and a curve of change of the figure of merit of a conventional trench field-effect device along with the gate voltage are included. Referring to FIG. 11, the breakdown voltage of the trench field-effect device is 65V for example. Curve 3 is a curve of change of the figure of merit ($RQ_g$) of a conventional trench field-effect device along with the gate voltage; curve 4 is a curve of change of the figure of merit ($RQ_g$) of a trench field-effect device along with the gate voltage according to an embodiment. It can be seen from FIG. 11, when $V_{gs}$=4.5V, as compared with the conventional trench field-effect device, the figure of merit ($RQ_g$) of the trench field-effect device that the embodiment of the present invention provides is reduced by 13%.

Each part in the detailed description is described in a progressive way. Each part emphasizes differences between the each part and other parts. Similar parts between each part can be referred to each other.

It is noted that, in the present invention, relation terms such as "first" and "second" are used only to distinguish one entity or operation from the other entity or operation, but not sure to demand or indicate that there are those actual relations or orders among those entities and operations. Furthermore, the terms "including", "comprising", or any other grammatical variations are used in the inclusive sense of "comprising" with non-excludability, so that process, method, article or device that includes series of the elements include not only those elements but also other elements that are not listed, or further include inherent elements of this process, method, article or device. In the case of no more restriction, an element defined by the sentence "including one . . . " does not indicate that there are no other same elements in the process, method, article or device that includes said element.

The above description of the embodiments makes those skilled in the art implement or use the present invention. Various modifications to these embodiments will be obvious to those skilled in the art. General principles defined in this article can be implemented in other embodiments without departing from the spirit or scope of the present invention. Therefore, the present invention will not be limited by the embodiments described in this article, and should meet the broadest scope consistent with the principles and the novelty disclosed by this article.

What is claimed is:

1. A method of fabricating a trench field-effect device, comprising:
    providing a substrate, the substrate comprising a relatively-lightly-doped monocrystalline silicon epitaxial layer formed on a semiconductor substrate of the substrate and a trench formed in the epitaxial layer;
    forming a sacrificial dielectric layer on a bottom and a sidewall of the trench with a thickness in a range from 400 Å to 2000 Å;
    forming a heavily-doped polysilicon region at the bottom of the trench, the doping concentration of the heavily-doped polysilicon region being over 20 times greater than that of the epitaxial layer, and removing a first part of the sacrificial dielectric layer that is not covered by the heavily-doped polysilicon region to expose an epitaxial layer of the sidewall of the trench while retaining a second part of the sacrificial dielectric layer that is covered by the heavily-doped polysilicon region; and
    oxidizing the heavily-doped polysilicon region and the epitaxial layer of the sidewall of the trench simultaneously, and forming a thick oxide layer and a trench sidewall gate dielectric layer synchronously on the bottom and the sidewall of the trench, respectively;
    wherein the thickness of the thick oxide layer is 2 to 4 times greater than that of the trench sidewall gate dielectric layer formed synchronously with the thick oxide layer, the thickness of the thick oxide layer is greatest in the center and continuously decreases toward the trench sidewalls, and the thick oxide layer is used as a trench bottom gate dielectric layer of the trench field-effect device, thereby reducing a capacitance between a gate and drain of the trench field-effect device, reducing a gate charge of the trench field-effect device and reducing the figure of merit of the trench field-effect device;
    wherein the thick oxide layer is formed on the second part of the sacrificial dielectric layer at the bottom of the trench, and wherein the thick oxide layer and the second part of the sacrificial dielectric layer cooperatively form the trench bottom gate dielectric layer in a gate dielectric layer of the trench field-effect device.

2. The method of claim 1, wherein the semiconductor substrate is a monocrystalline silicon substrate, the doping concentration of the epitaxial layer is smaller than that of the semiconductor substrate.

3. The method of claim 1, wherein the doping concentration of the epitaxial layer is less than or equal to 5E17 cm$^{-3}$.

4. The method of claim 1, wherein the doping concentration of the heavily-doped polysilicon region is greater than or equal to 1E19 cm$^{-3}$.

5. The method of claim 1, wherein a growth speed of the thick oxide layer is greater than that of the trench sidewall gate dielectric layer during oxidization.

6. The method of claim 1, wherein the oxidization uses a thermal oxidation process with high-pressure-and-wet-oxygen conditions.

7. The method of claim 6, wherein a pressure of the thermal oxidation process is greater than one standard atmospheric pressure.

8. The method of claim 1, wherein the thickness of the heavily-doped polysilicon region is in a range from 400 Å to 5000 Å.

9. The method of claim 1, wherein the thickness of the thick oxide layer is greater than or equal to 400 Å and less than or equal to 6000 Å.

10. The method of claim 1, wherein a doping type of the heavily-doped polysilicon region is N-type.

* * * * *